(12) United States Patent
Wölm

(10) Patent No.: US 7,094,143 B2
(45) Date of Patent: Aug. 22, 2006

(54) SECURITY HOUSING HAVING VENTILATION OPENINGS

(75) Inventor: Dieter Wölm, Gross Schulzendorf (DE)

(73) Assignee: Francotyp-Postalia GmbH, Birkenwerder (DE)

( * ) Notice: Subject to any disclaimer, the term of this patent is extended or adjusted under 35 U.S.C. 154(b) by 0 days.

(21) Appl. No.: 11/259,902

(22) Filed: Oct. 27, 2005

(65) Prior Publication Data
US 2006/0089096 A1   Apr. 27, 2006

(30) Foreign Application Priority Data
Oct. 27, 2004   (DE) ................. 20 2004 016 611 U

(51) Int. Cl.
*F24F 13/04* (2006.01)
(52) U.S. Cl. ...................... 454/254; 454/263
(58) Field of Classification Search ............ 454/254, 454/261, 263, 264, 284
See application file for complete search history.

(56) References Cited

U.S. PATENT DOCUMENTS

| | | | | |
|---|---|---|---|---|
| 380,145 | A * | 3/1888 | Scheidel | 454/331 |
| 633,455 | A * | 9/1899 | Hood | 454/290 |
| 767,228 | A | 8/1904 | Harrison | |
| 1,151,359 | A * | 8/1915 | Hood | 454/290 |
| 3,809,151 | A * | 5/1974 | Scheidel et al. | 165/42 |
| 4,886,384 | A | 12/1989 | Harry | |
| 4,964,566 | A * | 10/1990 | Pugh et al. | 236/49.3 |
| 6,273,145 | B1 * | 8/2001 | Botting | 138/166 |
| 6,694,759 | B1 * | 2/2004 | Bash et al. | 62/180 |
| 6,769,717 | B1 | 8/2004 | Pacifici | |

FOREIGN PATENT DOCUMENTS

EP    0 189 984 B1   8/1986

* cited by examiner

*Primary Examiner*—Derek S. Boles
(74) *Attorney, Agent, or Firm*—Laurence A. Greenberg; Werner H. Stemer; Ralph E. Locher

(57) ABSTRACT

A security housing contains a housing body having ventilation openings for supplying air to a heat source, in which air convection takes place for dissipating heat. First air guide elements are disposed in the housing body on a first side of each of the ventilation openings and are shaped for partly covering the ventilation openings. The first air guide elements each have a base integrally molded on the housing body, the bases are spaced apart from each other such that, in each case one of the ventilation openings is further defined. A removable security housing part is disposed inside the housing body and forms an air guide duct. Second air guide elements are disposed in the air guide duct and are shaped such that they cover the ventilation openings and the first guide elements such that, non-rectilinear air guidance is ensured.

10 Claims, 3 Drawing Sheets

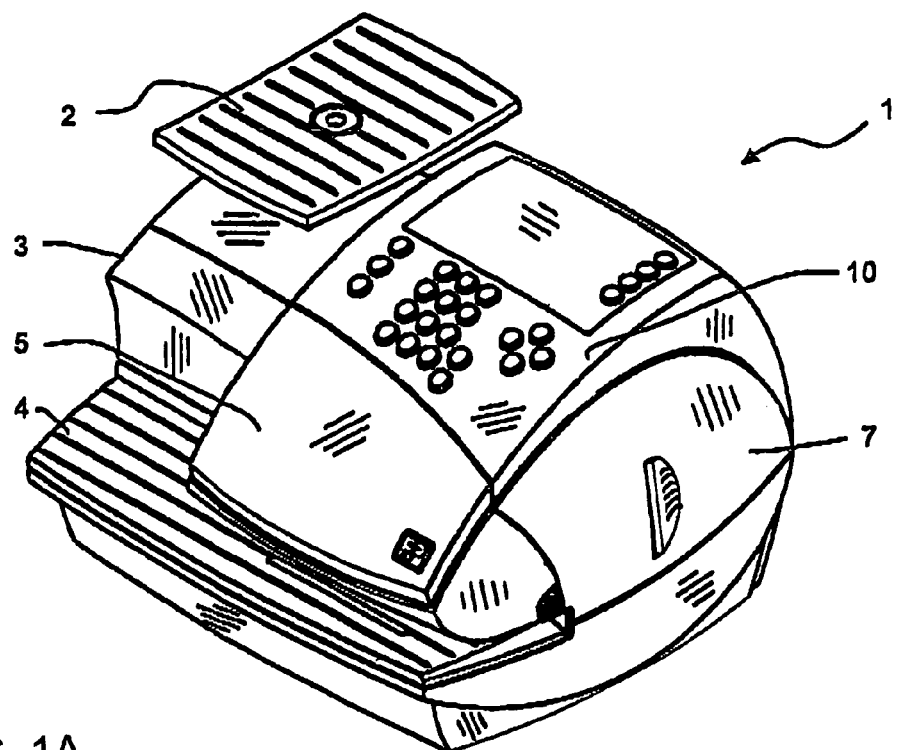
FIG. 1A
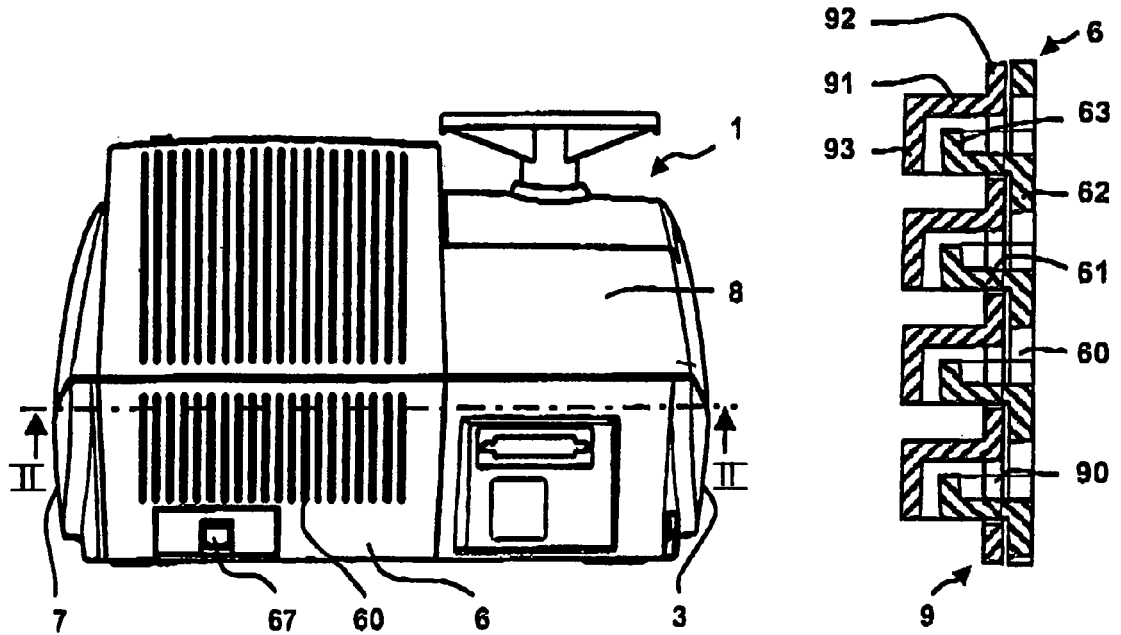
FIG. 1B
FIG. 2

SECURITY HOUSING HAVING VENTILATION OPENINGS

BACKGROUND OF THE INVENTION

Field of the Invention

The invention relates to a security housing having ventilation openings for supplying air to a heat source in the interior of an appliance. The appliance uses air convection to dissipate heat from a heat source and manages without a fan. The invention is used in franking machines and in similar printing and accounting or mail processing appliances.

U.S. Pat. No. 4,767,228, U.S. Pat. No. 4,886,384 and European patent EP 189 984 B1 disclose a thermal transfer franking machine, as is used in similar modern thermal transfer franking machines of the type T1000 or Optimal from the manufacturer Francotyp Postalia AG & Co. KG. There, ventilation slots are already provided on the rear of the security housing but do not block off views of the printed circuit board located underneath. The dissipation of heat takes place by convection or forcible ventilation. However, specific air guidance is not possible.

U.S. Pat. No. 6,769,717 B2 discloses a security chassis within a security housing of the Ultimail franking machine. Forcible air guidance by fans leads from the air outlet through ventilation openings on the rear of the security housing, which are not specifically protected against penetration by a tool. However, openings in the security chassis are described that make the penetration of tools into the secure region enclosed by two chassis shells impossible.

SUMMARY OF THE INVENTION

It is accordingly an object of the invention to provide a security housing having ventilation openings which overcomes the above-mentioned disadvantages of the prior art devices of this general type.

With the foregoing and other objects in view there is provided, in accordance with the invention, a security housing. The security housing contains a housing body having ventilation openings for supplying air to a heat source in an interior of the housing body, in which air convection takes place for dissipating heat from the heat source. First air guide elements are disposed on an inside of the housing body on at least a first side of each of the ventilation openings and are shaped such that the ventilation openings are at least partly covered. The first air guide elements each have a base integrally molded on the inside of the housing body, and the bases are spaced apart from each adjacent base such that, as a result, in each case one of the ventilation openings is further defined. A removable security housing part is disposed inside the housing body and forms an air guide duct. Second air guide elements are oriented in an interior of the air guide duct and are shaped such that the second air guide elements cover the ventilation openings of the housing base and the first guide elements at least to such an extent that, in a region of the first and second air guide elements, non-rectilinear air guidance is ensured.

The object is to form the ventilation openings in the security housing for leading an air stream to the heat source, the dissipation of heat taking place by convection without forcible ventilation. The ventilation openings should at the same time protect against penetration into the secure region. The security housing is to be distinguished by an ability to be fabricated easily and inexpensively.

The security housing has ventilation openings for supplying air to a heat source in the interior of and appliance, in which air convection takes place in order to dissipate heat from the heat source. First guide elements on the inside of the security housing are disposed on at least one side of each of the ventilation openings and are shaped in such a way that the latter are at least partly covered. A removable security housing part is provided with second air guide elements and is arranged in the interior of the appliance, the second air guide elements being disposed at intervals on a second side of each of the ventilation openings, respectively opposite the aforementioned first side, and are shaped such that they cover the ventilation openings of the security housing and first air guide elements at least to such an extent that, in the region of the first and second air guide elements, non-rectilinear air guidance is ensured. Therefore, the rectilinear insertion of tools through the ventilation openings, and therefore access to a secure region in the interior of the security housing, is prevented.

The ventilation openings can have the form of a slot or rectangle, so that two of the respectively opposite parallel sides are spaced apart closer to each other. On one of the last named two sides, first air guide elements are disposed on the inside of the security housing. The security housing part can be put on and removed from the direction of one of the two other respectively opposite parallel sides, but which are spaced apart further from each other, without its second air guide elements colliding with the first air guide elements.

The first air guide elements on the inside of the security housing can have a rib shape which project into the interior of the appliance. The second air guide elements preferably have the shape of a hood in order to cover the ribs when the security housing part is put on or mounted in the security housing.

Other features which are considered as characteristic for the invention are set forth in the appended claims.

Although the invention is illustrated and described herein as embodied in a security housing having ventilation openings, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A is a diagrammatic, perspective front and top right view of a thermal transfer franking machine according to the invention;

FIG. 1B is a diagrammatic, rear view of the thermal transfer franking machine;

FIG. 2 is a diagrammatic, sectional view of a detail of air guidance with a security housing part, being a Z variant;

DESCRIPTION OF THE PREFERRED EMBODIMENTS

Figure 3:
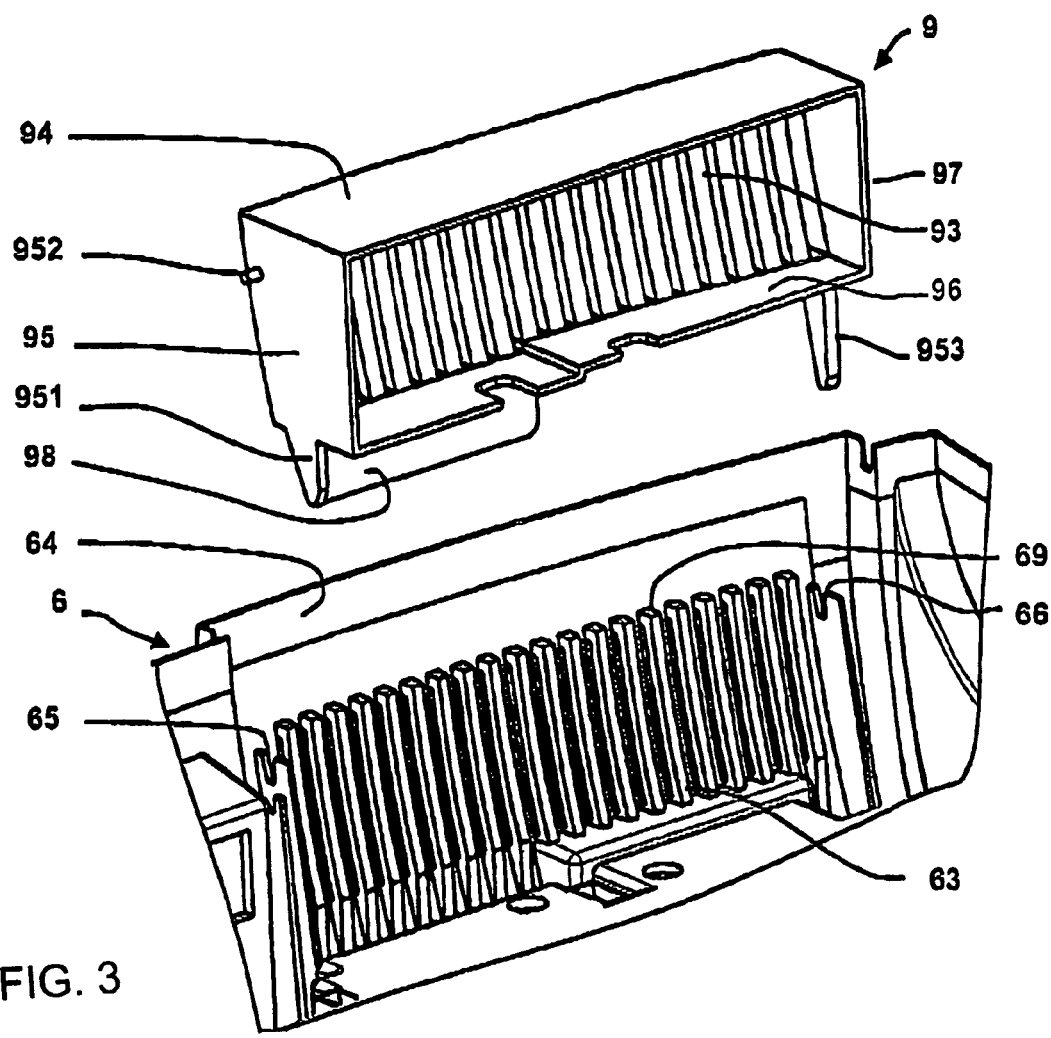
FIG. 3 is an exploded, perspective view of an extract from a lower shell of the security housing and the security housing part before assembly.

Referring now to the figures of the drawing in detail and first, particularly, to FIG. 1A thereof, there is shown a perspective view from the front and top right of a thermal transfer franking machine 1 of the next generation. The thermal transfer franking machine 1 is equipped on its right-hand side wall 7 of a security housing and on its upper part 10 with a flap 5 for the cassette compartment of the franking machine 1, and on its left-hand side with a scale pan 2 of a balance subassembly. On the left-hand side wall 3 of the security housing of the franking machine, covered by the view, a non-illustrated manual envelope closer can be attached. The supply and discharge of an item of mail is carried out on the feed table 4 of the franking machine, from left to right on the front side of the franking machine 1. All the housing parts are produced, for example, from colored plastic.

FIG. 1B shows a rear view of the thermal transfer franking machine 1 with the side walls 3, 7 and the rear wall 6, 8 of the security housing. On the outside of the rear wall 6 of a security housing rear shell, ventilation openings 60 for supplying air and further openings, such as for a modem connection 67, can be seen. On the outside of the rear wall 8 of a security housing upper shell, ventilation openings for dissipating heated air can be seen. The ventilation openings 60 for supplying air are illustrated in FIG. 2, taken along the line II—II shown in FIG. 1.

FIG. 2 shows a detail of air guidance with the security housing 9 and with the rear wall 6 of a security housing lower shell, the two of which are illustrated in cross section sectioned through the line II—II. Ribs are integrally molded with their rib bases 62 on the inside of the rear wall 6 of the security housing lower shell and, in cross section, are formed of a rib web 61 between the rib base 62 and a rib head 63, the rib base 62 being spaced apart from each adjacent rib base in such a way that the first air guide opening 60 is produced as a result. The security housing part 9 disposed close to the inside of the security housing has integrally molded hoods, which cover the ribs. In cross section, the hoods on the security housing part 9 are formed of a hood web 91 between a hood base 92 and a hood roof 93, the hood base 92 being spaced upon from each adjacent hood base such that a second air guide opening 90 is produced as a result. As a result of forming the hoods in a Z shape in a plan view of the cross section through the upper edge of the rear wall 6 of the security housing lower shell (view of FIG. 2 rotated to the left) and forming the ribs in cross section in a manner similar to an inverted Z shape at the edge, as a result of their arrangement in relation to one another, penetration of a tool into the interior is prevented, although the two openings 60 and 90 are located one above the other.

FIG. 3 illustrates an extract from the rear wall 6 of the lower shell of the security housing and the security housing part 9 before its assembly, in a perspective view from the front left and above. With the ribs aligned at right angles or at an angle thereto, there is in each case an opening at the side which, at its end pointing upward and downward, is closed by at least one side wall 69 and, oriented toward the interior, is roofed over by the rib head 63. With the security housing part 9, which is shown as removed but can additionally be disposed, penetration of the interior (secure region) can be prevented. The security housing part has hoods with the hood roof 93 that is suitably shaped to cover a rib head. In the hoods there are openings, oriented toward the right and not visible here, to which the air from outside can flow into the interior to the secure region. The security housing part 9 is shaped such that the result is a duct that leads the air stream directly to the heat source in the secure region on the printed circuit board. The security housing part is, for example, shaped like a box, having an upper part 94, a left-hand side part 95, a lower part 96, a right-hand side part 97, and a left-hand and right-hand guide part 951, 953 extending downward from the lower part 96 on the left-hand and right-hand side part 95, 97. In addition, a rear wall 98 of the security housing part 9 can extend downward from the lower part 96. Disposed on the side parts 95, 97 is a holding pin 952, 972 in each case, which fits together with an associated holder 65, 66 in a form-fitting manner.

Figure 4:
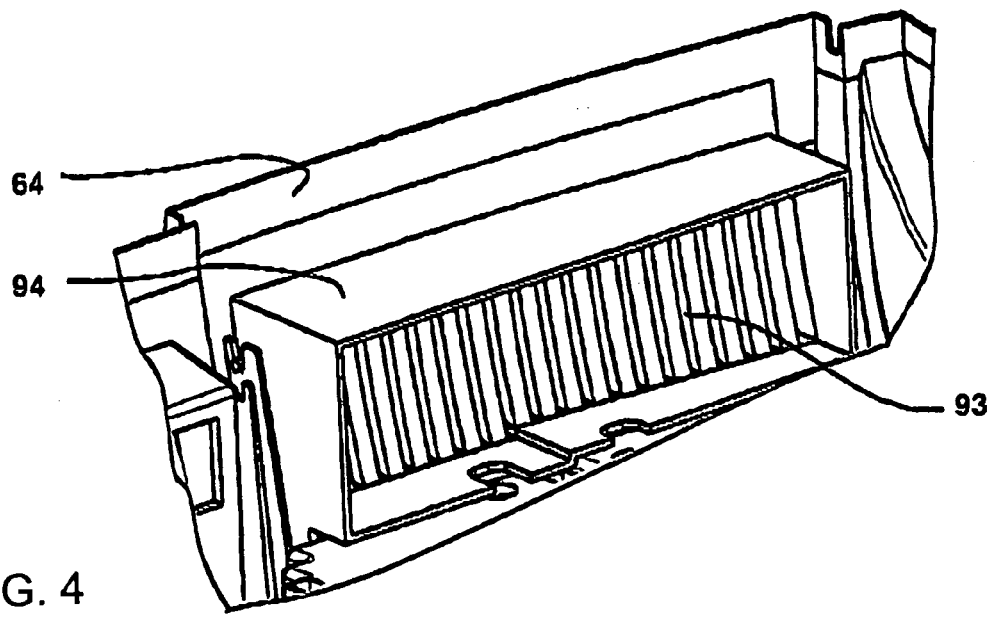
FIG. 4 is a perspective view of an extract from the lower shell and the security housing part after their assembly.

FIG. 4 shows the extract of the lower shell and the security housing part after their assembly. The security housing part, fitted in the interior on the inside 64, has the at least one upper part 94 and hoods, whose hood roof 93 is disposed over the ribs such that penetration into the interior (secure region) without demonstrable damage to the security housing is impossible.

Alternatively, the security housing part can be shaped so as to deviate from the rectangular box shape, but the result then again being a duct with, for example, an oval, circular, triangular or trapezoidal cross section, which leads the air stream directly to the heat source in the secure region on the printed circuit board.

Even though the first and second air guide elements shown in FIG. 2 (Z variant) have been illustrated as hoods bent in a Z shape and, respectively, inverted Z-shaped ribs in the rear wall 6, this is not intended to signify any restriction in the shaping of the air guide elements.

Figure 5:
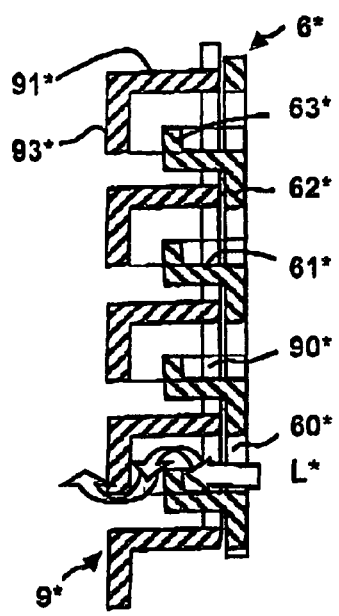
FIG. 5 is a sectional view of a detail of the air guidance with the security housing part, showing an L variant.

FIG. 5 shows a detail of air guidance with the security housing part of an alternative variant, the hoods having an L-shaped form in cross section in a plan view of the rear of the rear wall 6 of the security housing lower shell (view of FIG. 5 rotated to the left) and the ribs having in cross section the inverted Z shape at the upper edge. The ribs integrally molded on the inside of the security housing lower shell 6\* formed of the rib web 61\* between the rib base 62\* and the rib head 63\*, the rib base 62\* being spaced apart form each adjacent rib base such that, as a result, the first opening 60\* is produced. The security housing part 9\* disposed close to the inside of the security housing has integrally molded hoods, which cover the ribs. The hoods on the security housing part 9\* each are formed of a hood web 91\* and hood roof 93\*, which are connected in an L shape in cross section, in each case a second opening 90\* being produced between adjacent rib webs 61\* and hood webs 91\*.

Alternatively, in a non-illustrated further variant, the ribs can also have a ⌐shape (laterally inverted L shape) and the hoods an L shape in cross section.

Figure 6:
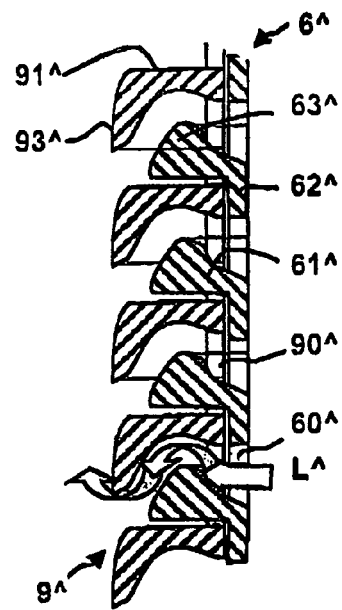
FIG. 6 is a sectional view of a detail of the air guidance with the security housing part, showing a B variant.

FIG. 6 shows a detail of air guidance with the security housing part of an alternative B variant, both air guide elements being of streamlined form in cross section, that is to say the hoods formed of hood web 91ˆ and hood roof 93ˆ having a curved shape (B shape) and the ribs formed of rib web 61ˆ, rib base 62ˆ and rib head 63ˆ having a rounded shape. Between rib base and adjacent rib base 62ˆ in each case the resists a first air guide opening 60ˆ, and between adjacent rib webs 61ˆ and hood webs 91ˆ in each case there exists a second air guide opening 90ˆ.

Figure 7:
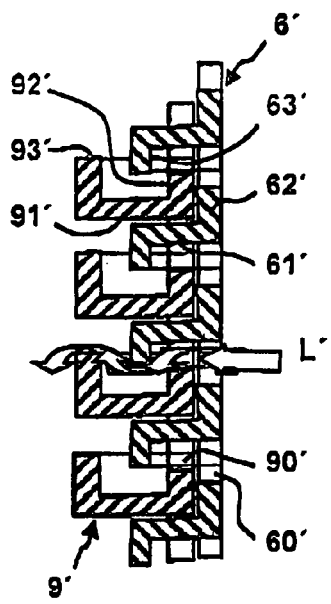
FIG. 7 is a sectional view of a detail of the air guidance with the security housing part, showing a U variant.

FIG. 7 shows a detail of the air guidance with security housing part of an alternative U variant, both air guide elements being shaped at right angles, that is to say the hoods having a squared U shape in a plan view of FIG. 7. In a plan view of the edge of the rear wall 6 of he security housing lower shell (or a view of FIG. 7 rotated 90° to the left), the hoods have a squared U shape and the ribs a Z shape. This variant with rectangular air guide elements 61', 62', 63' and 91', 92', 93' can also be improved in terms of flow by all the corners and edges being shaped in rounded form. In this way, for example, in a manner not shown, the squared U shape becomes a squared U shape (in the view of FIG. 7) or a J shape (in a plan view of the edge of the rear wall 6). Alternatively, instead of the view of FIG. 7, a V shape (not shown) can also be used for the hoods.

Figure 8:
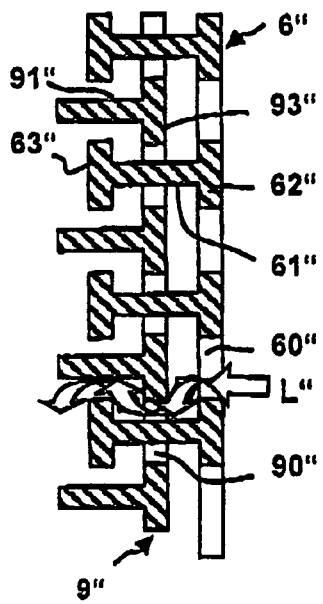
FIG. 8 is a sectional view of a detail of the air guidance with the security housing part, showing an H variant.

A further H variant, shown in FIG. 8, for details of the air guidance with security housing part is produced when a symmetrical form of the two air guide elements 61", 62", 63" and 91", 92", 93" is used. In a plan view of FIG. 8, the ribs have an H shape and the hoods have the shape of a lying T. In other words, in a plan view of the edge of the rear wall 6 of the security housing lower shell (or a view of FIG. 8 rotated through 90° to the left), the ribs have an I shape and the hoods a T shape.

This variant with rectangular air guide elements 61", 62", 63" and 91", 92", 93" can also be improved in terms of flow to a streamlined form, not shown, by all the corners and edges being shaped in rounded form. The hoods than have a teardrop shape and the ribs the shape of a lying hourglass.

Figure 9:
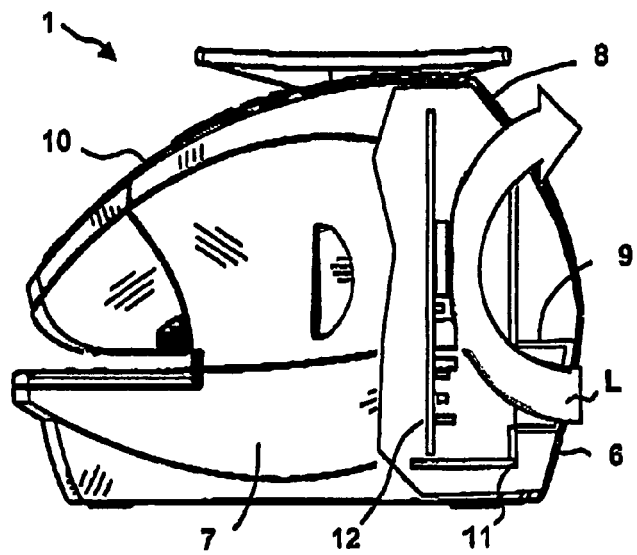
FIG. 9 is a side view of the thermal transfer franking machine.

In FIG. 9, the thermal transfer franking machine 1 has been illustrated in a side view from the right, the right-hand side wall 7 having been shown as cut open at the rear edge from the upper part 10 of the upper shell as far as the lower shell of the security housing, in order to illustrate the air guidance L. Air is supplied via air openings in the rear wall 6 of the lower shell of the security housing and heated air is led away to the outside via ventilation openings in the rear wall 8 of the upper shell of the security housing. The security housing part 9 forms a duct for specific air guidance to a printed circuit board 12 with electronic components and likewise prevents access from outside to the electronic components by a curved air supply path. A further duct can be formed in the interior via chassis parts 11 for the specific supply and discharge of air. The heated air is lighter than cool air and rises. In the process, cooler air is taken in via the duct. Since the appliance uses air convection to dissipate heat from the heat source, it manages without a fan. Although the invention has been explained only by using a franking machine, the use of other appliances is not intended to be ruled out. These appliances can also have circular or otherwise shaped longitudinal, oblique or transverse ventilation openings, it merely being necessary for the security housing part 9 to be adapted appropriately. However, it is important that two air guide elements project into the air path exposed by each ventilation opening and cover each other, starting from the opposite or adjacent sides of the ventilation opening, a first air guide being integrally molded on the inside of the security housing and a second air guide element being integrally molded on the inside of the security housing part. The security housing part 9 can advantageously be produced of plastic or metal in the injection molding process. The angular variants can also be punched out of sheet metal.

Thus, further other embodiments of the invention can obviously be developed and used which originate from the same basic idea of the invention and are covered by the appended claims.

This application claims the priority, under 35 U.S.C. § 119, of German patent application No. 20 2004 016 611.9, filed Oct. 27, 2004; the entire disclosure of the prior application is herewith incorporated by reference.

I claim:

1. A security housing, comprising:
   a housing body having ventilation openings formed therein for supplying air to a heat source in an interior of said housing body, in which air convection takes place for dissipating heat from the heat source;
   first air guide elements disposed on an inside of said housing body on at least a first side of each of said ventilation openings and being shaped such that said ventilation openings are at least partly covered, said first air guide elements each having a base integrally molded on said inside of said housing body, said base being spaced apart from each adjacent said base such that, as a result, in each case one of said ventilation openings being further defined;
   a removable security housing part disposed inside said housing body and forms an air guide duct; and
   second air guide elements oriented in an interior of said air guide duct and shaped such that said second air guide elements cover said ventilation openings of said housing base and said first guide elements at least to such an extent that, in a region of said first and second air guide elements, non-rectilinear air guidance is ensured.

2. The security housing according to claim 1, wherein:
   said first air guide elements are ribs having in each case in cross section said base being a rib base, a rib web and a rib head for air guidance in a first direction deviating from rectilinear air guidance; and
   said second air guide elements are hoods having in each case in cross section at least one hood web and a hood roof for air guidance in a second direction deviating from the rectilinear air guidance, the second direction running opposite to the first direction.

3. The security housing according to claim 2, wherein:
   said housing body has a rear wall;
   said rib web is disposed between said rib base and said rib head, said ribs having a shape in cross section being substantially an inverted Z shape as view at an edge of said rear wall;
   said second air guide elements each have a hood base; and
   said hood web is disposed between said hood base and said hood roof, said hoods having a substantially Z shape in a plan view of an edge of said housing body.

4. The security housing according to claim 2, wherein:
   said rib web is disposed between said rib base and said rib head, said ribs having in cross section a substantially Z shape;
   said second air guide elements each have a hood base; and
   said hood web is disposed between said hood base and said hood roof, said hoods having a substantially J shape in a plan view of an edge of said housing body.

5. The security housing according to claim 2, wherein:
   said rib web is disposed between said rib base and said rib head, said ribs having in cross section a substantially inverted Z shape as viewed at an edge of said housing body;
   said second air guide elements each have a hood base; and
   said hood web disposed between said hood base and said hood roof, said hoods having a substantially L shape in a plan view of said edge of said housing base.

6. The security housing according to claim 2, wherein, in cross section, said ribs and said hoods each have a symmetrical shape.

7. The security housing according to claim 2, wherein said ribs and hoods have corners and edges that are rounded and, in cross section, a streamlined shape.

8. The security housing according to claim 2, wherein:
said housing body has a rear wall;
said first air guide elements are integrally molded on said inside of said rear wall;
said housing body is a housing of a franking machine; and
said second air guide elements in each case have an element part, which are disposed at a distance on a second side in each case opposite the first side of each of said ventilation openings such that, as a result, in each case second air guide openings are defined; and
said removable security housing part is disposed such that said ventilation openings in said rear wall and said second air guide openings are located one above another.

9. The security housing according to claim 8, wherein said element part is said hood base.

10. The security housing according to claim 8, wherein said element part is said hood web.

* * * * *